(12) United States Patent
Linares et al.

(10) Patent No.: US 8,058,085 B2
(45) Date of Patent: Nov. 15, 2011

(54) METHOD OF FORMING A WAVEGUIDE IN DIAMOND

(75) Inventors: Robert C. Linares, Sherborn, MA (US); Patrick J. Doering, Holliston, MA (US); William W. Dromeshauser, Norwell, MA (US); Bryant Linares, Sherborn, MA (US); Alfred R. Genis, East Douglas, MA (US)

(73) Assignee: Apollo Diamond, Inc, Framingham, MA (US)

( * ) Notice: Subject to any disclaimer, the term of this patent is extended or adjusted under 35 U.S.C. 154(b) by 574 days.

(21) Appl. No.: 11/996,482

(22) PCT Filed: Jul. 11, 2006

(86) PCT No.: PCT/US2006/027196
§ 371 (c)(1),
(2), (4) Date: Nov. 19, 2008

(87) PCT Pub. No.: WO2007/009037
PCT Pub. Date: Jan. 18, 2007

(65) Prior Publication Data
US 2009/0214169 A1    Aug. 27, 2009

(51) Int. Cl.
*H01L 21/00* (2006.01)
(52) U.S. Cl. ... 438/31; 438/105; 438/795; 257/E21.041; 257/E21.085; 257/E21.324
(58) Field of Classification Search ............ 438/31, 438/105, 795
See application file for complete search history.

(56) References Cited

U.S. PATENT DOCUMENTS

| | | | |
|---|---|---|---|
| 5,587,210 A | 12/1996 | Marchywka et al. | |
| 6,582,513 B1 | 6/2003 | Linares et al. | |
| 6,613,601 B1 | 9/2003 | Krauss et al. | |
| 6,858,080 B2 * | 2/2005 | Linares et al. | 117/86 |
| 7,122,837 B2 | 10/2006 | Linares et al. | |
| 7,427,525 B2 * | 9/2008 | Santori et al. | 438/31 |
| 7,829,377 B2 | 11/2010 | Linares et al. | |
| 2001/0014526 A1 | 8/2001 | Clevenger et al. | |
| 2003/0155851 A1 | 8/2003 | Pehrsson et al. | |
| 2004/0021408 A1 | 2/2004 | Wort et al. | |

(Continued)

FOREIGN PATENT DOCUMENTS

CN    1441860 A    9/2003

(Continued)

OTHER PUBLICATIONS

"U.S. Appl. No. 11/178,623, Notice of Allowance mailed Apr. 10, 2006", 7 pgs.

(Continued)

*Primary Examiner* — Evan Pert
(74) *Attorney, Agent, or Firm* — Schwegman, Lundberg & Woessner, P.A.

(57) ABSTRACT

N-V centers in diamond are created in a controlled manner. In one embodiment, a single crystal diamond is formed using a CVD process, and then annealed to remove N-V centers. A thin layer of single crystal diamond is then formed with a controlled number of N-V centers. The N-V centers form Qubits for use in electronic circuits. Masked and controlled ion implants, coupled with annealing are used in CVD formed diamond to create structures for both optical applications and nanoelectromechanical device formation. Waveguides may be formed optically coupled to the N-V centers and further coupled to sources and detectors of light to interact with the N-V centers.

16 Claims, 3 Drawing Sheets

U.S. PATENT DOCUMENTS

| | | | |
|---|---|---|---|
| 2004/0221795 | A1 | 11/2004 | Scarsbrook et al. |
| 2005/0031785 | A1 | 2/2005 | Carlisle et al. |
| 2006/0157713 | A1 | 7/2006 | Linares et al. |
| 2006/0172515 | A1* | 8/2006 | Olivero et al. ............. 438/515 |
| 2006/0234419 | A1 | 10/2006 | Linares et al. |
| 2011/0054450 | A1 | 3/2011 | Linares et al. |

FOREIGN PATENT DOCUMENTS

| | | | |
|---|---|---|---|
| EP | 0745707 A1 | | 12/1996 |
| EP | 1119045 A2 | | 7/2001 |
| GB | 2 394 553 A | * | 4/2004 |
| JP | 2-385 A | | 1/1990 |
| JP | 2-385 | | 5/1990 |
| WO | WO-01/96633 A1 | | 12/2001 |
| WO | WO-2006/076354 A2 | | 7/2006 |
| WO | WO-2007/009037 A1 | | 1/2007 |

OTHER PUBLICATIONS

"U.S. Appl. No. 11/178,623, Supplemental Notice of Allowability mailed May 23, 2006", 3 pgs.

"U.S. Appl. No. 11/329,959, Response filed Dec. 22, 2008 to Non-Final Office Action mailed Jun. 27, 2008", 13 pgs.

"U.S. Appl. No. 11/329,959, Non-Final Office Action mailed Jun. 27, 2008", 5 pgs.

"Chinese Application No. 200680007879.6, Office Action mailed Feb. 6, 2009", (English Translation), 11 pgs.

"International Application Serial No. PCT/US2006/000808, International Search Report mailed Aug. 25, 2006", 6 pgs.

"International Application Serial No. PCT/US2006/000808, Written Opinion mailed Aug. 25, 2006", 10 pgs.

"International Application Serial No. PCT/US2006/000808, Invitation to Pay Additional Fees mailed May 23, 2006", 9 pgs.

"International Application Serial No. PCT/US2006/027196, International Search Report mailed Oct. 24, 2006", 4 pgs.

"International Application Serial No. PCT/US2006/027196, Written Opinion mailed Oct. 24, 2006", 7 pgs.

Biersack, J. P, et al., "A Monte Carlo Computer Program for the Transport of Energetic Ions in Amorphous Targets", *Nuclear Instruments and Methods*, 174, (1980), 257-269.

Charnock, F. T, et al., "Combined Optical and Microwave Approach for Performing Quantum Spin Operations on the Nitrogen-Vacancy Center in Diamond", *Physical Review B (Condensed Matter and Materials Physics)*, 64(4), (2001), 041201-1-041201-4.

Drabenstedt, A., et al., "Low-temperature Microscopy and Spectroscopy on Single Defect Centers in Diamond", *Physical Review B*, 60(16), (Oct. 15, 1999), 11503-11508.

Gruber, A., et al., "Scanning Confocal Optical Microscopy and Magnetic Resonance on Single Defect Centers", *Science*, vol. 276, (Jun. 1999), 2012-2014.

Hemmer, P., et al., "Raman excited spin coherences in N-V diamond", *Lasers and Electro-Optics Conference*, (2001), 374-375.

Hoshikawa, K., et al., "Production of a bridge structure using diamond film", *Thin Solid Films*, 281/282(1/2), (1996), 545-547.

Hunn, J. D, "Ion Beam and Laser-Assisted Mcromachining of Single-Crystal Diamond", *Solid State Technology*, 37(12), (1994), 57-60.

Kennedy, T. A, et al., "Single-Qubit Operations with the Nitrogen-Vacancy Center in Diamond", *Physica Status Solidi B*, 233(3), (2002), 416-426.

Kennedy, T. A., et al., "Long coherence times at 300 K for nitrogen-vacancy center spins in diamond grown by chemical vapor deposition", *Applied Physics Letters*, 83(20), (2003), 4190-4192.

Kilinn, S., et al., "Model Systems and photo-kinetics of single N-V defect centers in diamond", *2000 International Quantum Electronics Conference. Conference Digest*, (Abstract Only), (2000), 2 pgs.

Rabeau, J. R, et al., "Diamond Chemical-Vapor Deposition on Optical Fibers for Fluorescence Waveguiding", *Applied Physics Letters*, 86(13), (2005), 134104-1-134104-3.

Wrachtrup, J., "Optocal spectroscopy and control of single defect centers in solids.", *Postconference Digest of Quantum Electronics and Laser Science (QELS)*, (2003), 3 pgs.

"U.S. Appl. No. 11/329,959, Restriction Requirement mailed Apr. 22, 2009", 7 pgs.

"U.S. Appl. No. 11/329,959, Response filed Jul. 22, 2009 to Restriction Requirement mailed Apr. 22, 2009", 7 pgs.

"Chinese Application Serial No. 200680025412.4, First Office Action mailed on Jun. 19, 2009", (English Translation), 6 pgs.

"European Application Serial No. 06717944.0, Communication mailed Mar. 13, 2009", 6 pgs.

"European Application Serial No. 06717944.0, Response filed Aug. 26, 2009 to Communication mailed Mar. 13, 2009", 17 pgs.

"European Application Serial No. 06787142.6 , Communication mailed Sep. 8, 2009", 2 pgs.

"U.S. Appl. No. 11/329,959, Non-Final Office Action mailed Nov. 24, 2009.", 10 pgs.

"U.S. Appl. No. 11/329,959, Response Filed Apr. 26, 2010 to Non-Final Office Action mailed Nov. 24, 2009.", 7 pgs.

"U.S. Appl. No. 11/329,959, Notice of Allowance mailed Jul. 9, 2010", 8 pages.

"Australian Application Serial No. 2006268130, Examiner Report mailed Feb. 7, 2011", 4 pgs.

"Chinese Application Serial No. 200680025412.4, Response filed Oct. 30, 2009 to First Office Action mailed Jun. 19, 2009", (w/ English Translation of Claims), 7 pgs.

* cited by examiner

METHOD OF FORMING A WAVEGUIDE IN DIAMOND

RELATED APPLICATIONS

This application is a U.S. National Stage Filing under 35 U.S.C. 371 from International Patent Application Serial No. PCT/US2006/027196, filed Jul. 11, 2006, which claims the priority benefit of U.S. patent application Ser. No. 11/178,623, filed Jul. 11, 2005, which applications and publication are incorporated herein by reference and made a part hereof.

BACKGROUND

Common computers provide digital processing in which data are held in positive or negative states (or off and on states) of a device. Digital devices can be semiconducting, magnetic, optical, piezoelectric or other devices. This is referred to as digital computing and it is the economic and technical heart of all current computers, semiconducting devices for computers and computer software. The act of using a digital technology requires that all data must be identified as powers of "2", this in turn requires that data manipulation, speed, storage, etc that expand at this enormous rate.

This digital route requires significant increases in semiconductor chip size, speed and complexity to accommodate even modest improvements in performance. Semiconductor engineers have responded by making devices smaller and with smaller spacing with larger numbers of devices and ever increasing complexity. The requirements for smaller spacing have pushed the limits of material and photolithography capability and it is estimated that we are reaching the limits of Moores Law (which states that devices will continue to decrease in size and double in capacity every 18 months); in addition, the amount of heat produced by decreasing device spacing is imperiling device performance. The digital computer is rapidly becoming too large and too complex for large number manipulations such as weather analysis, high level encryption, drug discovery, genetic manipulation and many other applications as yet undiscovered because of the limitations on digital computers.

An entirely new type of computer has been proposed which is based on quantum behavior. The spin state of an atom or group of atoms can be manipulated using a number of methods and the spin state can be detected, and/or controllably altered, using an energy source or detector such as an optical source or detector. An atom or atoms with discrete spin states are analogous to a bit in a traditional computer. However, due to the quantum nature of the spin states, a quantum bit (or qubit) can exist in not just one of two states, but also in a superposition of these states. It is this superposition of states which makes it possible for qubit based computers to analyze information at a much greater speed than is possible for traditional computers.

The name Qubit is quite generic in that devices can be made which use (and need to use) only one Qubit whereas others may use many Qubit s. Devices which have been proposed include single Qubit optical amplifiers for encrypted and very high speed messages, multiple Qubit devices for information storage, and multiple Qubit devices for high speed and high density computing. Because the atom can exist in a large number of spin states simultaneously, the interaction of spin states enables a high number of computations with only a small number of atoms. The entire Qubit chip of a supercomputer might well be smaller than a fingernail. In addition, Qubit technology holds promise for combining with optical waveguide technology building high speed optical busses for conventional computers while increasing encryption capabilities.

Magnetic spin states can be generated in a large number of materials including liquids and solids. However to be useful for a quantum computer, several conditions must be met; 1. The spin state must be capable of being excited; 2. The spin state must be detectable; 3. The spin state must have a lifetime which is long enough to permit the intended calculation to be done and the result to be detected; 4. The device must operate at a practical temperature.

A large number of materials have been proposed for use as Qubit hosts including semiconductors (including quantum dot semiconductors) and superconductors. All of these materials to date have the disadvantage of operation at cryogenic temperatures and or having short spin lifetimes. It has been discovered that the N-V center in diamond had not only the longest spin lifetime of any material but it had this property at room temperature. An N-V center is nitrogen in a substitutional site in diamond which is adjacent to a carbon vacancy. There is an N-V$^-$ center with a negative charge, an N-V$^0$ center which is similar but has no charge and a Ns center which is nitrogen substituted for carbon with no adjacent vacancy. The N-V center typically is in one of two charge states, negatively charged N-V$^-$ and neutral N-V$^0$.

The N-V center in diamond has several attributes which make it desirable for Qubit based devices. It is easily pumped using low power microwaves. It is also easily detected (emission at 675 nanometers wavelength). Such N-V centers in diamond may have long lifetimes (60 to 500 microseconds) and room temperature operation. Diamond also has a high degree of optical transparency and a high optical index of refraction, enabling construction of optical waveguides and other optical structures.

SUMMARY

N-V centers in diamond can be created in a controlled manner. In one embodiment, a single crystal diamond is formed using a CVD process, and then annealed to remove N-V centers. A thin layer of single crystal diamond is then formed with a controlled number of N-V centers. The N-V centers form Qubits for use in electronic circuits.

Masked and controlled ion implants, coupled with annealing are used in CVD formed single crystal diamond to create structures for both optical applications and nanoelectromechanical device formation. Ion implantation is employed to deliver one or more atomic species into and beneath the diamond growth surface in order to form an implanted layer with a peak concentration of atoms at a predetermined depth beneath the diamond growth surface. The composition is heated in a non-oxidizing environment under suitable conditions to cause separation of the diamond proximate the implanted layer. Further ion implants may be used in released structures to straighten or curve them as desired. Boron doping may also be utilized to create conductive diamond structures.

In one embodiment, a nanochannel is formed by implanting ions in a diamond at a point where the nanochannel is desired. Masks may be used to control a width and length of the implant, and selected implant power levels can be utilized to control the depth of the implant. Heating the diamond causes a separation to occur at or about the implant. Such separation may be used as a nanochannel for conveying fluids, or as a low refractive index portion of a waveguide.

Further implants may be sized and shaped to form an etalon, optical filter, or optical deflector. An approximately 500 nm circular shape is used in one embodiment. Using a progression of masks and implant depths can provide for formation of many different mechanical structures, such as those that may be formed in silicon. Further layers of synthetic diamond of one or more diamond layers may be grown following the implants.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description is, therefore, not to be taken in a limited sense, and the scope of the present invention is defined by the appended claims.

N-V centers in diamond can be created in a controlled manner. In one embodiment, a single crystal diamond is formed using a CVD process with nitrogen included in the growth process, and then annealed to remove N-V centers. A thin layer of single crystal diamond is then formed with a controlled number of N-V centers. The N-V centers form Qubits for use in electronic circuits.

Qubit devices are formed in diamond having highly controlled purity. A highly controlled number of N-V centers can be produced, and the N-V centers are isolated from each other and from other elements having a magnetic spin such as N-V0, Ns and 13C (carbon 13). In one embodiment, single, isolated N-V centers are used to obtain information from individual atoms rather than from clusters. In further embodiments, it may be desirable to have N-V adjacent to 13C. In still further embodiments, the diamond has high crystal perfection since imperfections lead to shorter spin lifetimes and nitrogen tends to segregate at imperfections such as dislocations giving the effect of a higher concentration and the attendant interaction between adjacent spins and reduction of lifetime.

In one embodiment, light is able to enter and leave the diamond host material in a controlled manner. When a Qubit emits light, the light will be emitted over a spherical surface and the light intensity at any point will be very low and difficult to detect. The Qubit is contained within an optical waveguide which traps and directs the light in a minimum number of directions. Diamond is ideal for such a waveguide since it has a very high index of refraction (2.4 in the visible range). A thin layer of diamond in contact with air or vacuum on both sides provides such a waveguide. Diamond has a significantly higher index of refraction than air, such that a light beam propagating down the waveguide is internally reflected by the walls of the diamond waveguide and be confined to the diamond waveguide. With the Qubit within the diamond waveguide, most of the light emitted by the Qubit will be transmitted down the waveguide and be readily collected and detected. Other forms of transmission may also be utilized, such as by means of a plasma waveguide or slot waveguide. In still further embodiments, small metal wires are utilized to draw light from a Qubit. The light propagates on the outside of the wire within a diamond cladding.

One method for building a Qubit device involves growing single crystals by the HPHT method, incorporating a desired amount of nitrogen atoms which will all be Ns, irradiating the diamond to generate carbon vacancies and annealing to diffuse the carbon vacancies to the nitrogen atoms thereby causing N-V centers. This method may result in irradiation causing a significant level of crystal damage which decreases Qubit lifetime.

Another method of producing N-V centers in HPHT diamond involves growing the diamond with a titanium or aluminum getter to remove all of the nitrogen from the diamond and put nitrogen into the diamond later by ion implantation into selected spots. This method may not lend itself well to production of large size diamond wafers which would be suitable for device production.

Figure 1:
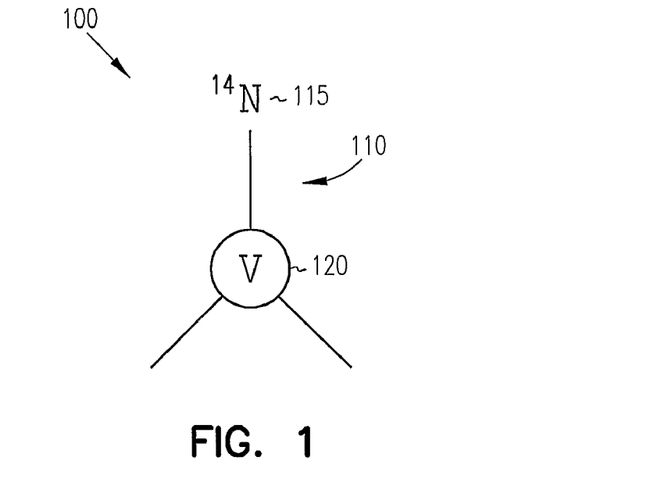
FIG. 1 is a block representation of a diamond having an N-V center according to an example embodiment.

FIG. 1 is a block representation of a diamond crystal lattice 100 having an N-V$^-$ center 110 according to an example embodiment. Center 110 is also representative of N-V centers with different charge states. As described above, an N-V$^-$ center 110 is nitrogen 115 in a substitutional site in diamond which is adjacent to a carbon vacancy 120. In FIG. 1, the N-V$^-$ center 110 is isolated from other N-V centers such that spins of other centers and other structures do not interfere with the isolated N-V$^-$ center, thus forming a Qubit.

The N-V$^-$ center 110 in diamond has several attributes which make it desirable for Qubit based devices. It is easily pumped using low power microwaves. It is also easily detected (emission at 675 nanometers wavelength). Such N-V$^-$ centers in diamond have long lifetimes (60 to 500 microseconds) and room temperature operation. Diamond also has a high degree of optical transparency and a high optical index of refraction, enabling construction of optical waveguides and other optical structures.

One method of producing N-V centers involves the use of CVD grown diamond. CVD diamond can be grown in large sizes with highly controlled purity as seen in (see U.S. Pat. No. 6,582,513) and with layers of controlled purity, thickness and properties. CVD diamond may be grown with high or low nitrogen concentrations, thin layers with or without 13C. N-V center formation may be controlled by several means.

CVD diamond grows under conditions where N-V$^-$, N-V$^0$ and Ns are all stable. Furthermore the ratios of these states can be varied by the growth conditions, the concentration and by heat treatment after growth. Moreover, it is possible to grow a substrate which is essentially free of all states of nitrogen and then grow a film of diamond which has only the desired level of nitrogen. Since the number of atoms of nitrogen in the film will be a function of concentration and thickness, N-V⁻ centers may be isolated from all other centers. In other words, given a known concentration of N-V centers that will be formed in a given volume of CVD grown diamond, making the diamond layer very thin assures that very few N-V centers are formed, and are thus isolated from each other.

In further embodiments, a carbon source for the CVD growth of the film has a desired level of 13C carbon by either depleting the 13C in the source gas or by enriching the 13C level. In one embodiment, a separation of about 2 microns is desired for non interaction between a N-V⁻ and other N centers. This is estimated at about 10 ppb which has already been demonstrated. Additionally, a diamond layer of only nominal purity may be grown and then annealed at high temperature to convert all N-V centers to Ns. This removes any extraneous signal from stray N-V atoms since Ns does not have an optical signal at the N-V⁻ wavelength. It can also be appreciated that a number of layers can be grown which are alternating between high purity and specific numbers of N-V centers to obtain a three dimensional structure having isolated N-V in adjacent layers. Each layer may be designed as a waveguide as described below, and have multiple and separated functions.

In each of the above embodiments, N-V centers may be randomly placed in the volume of the crystal, but can be readily found and marked for detection during the operation of the device.

In further embodiments, different types of diamond may be used, such as natural, mined diamonds, high pressure, high temperature manufactured diamonds, CVD formed diamonds or others. Such diamond may then be annealed to destroy N-V centers, followed by implantation to create desired densities of N-V centers, and further implantation to form waveguides.

An alternate method utilizes very pure bulk crystal with or without the film of desired isotopic purity, heat treat to destroy all residual N-V centers and then implant single, isolated, N-V centers at desired locations. A capping layer of highly pure diamond may then be grown on the layer.

Waveguides may be formed proximate the N-V centers and optically coupled to them. In one embodiment, Hydrogen is implanted in the diamond in stripes, followed by heat treating the structure to create a cavity which separates the strip of diamond from the underlying diamond. The strip of diamond is essentially surrounded by air and is used as an optical waveguide for bringing signals into and out of the diamond structure. It provides a highly isolated optical signal in and out and allows for multiple channels for optical in and out on a single diamond chip. Furthermore multiple functions may be provided, such as amplifiers, storage and computing all on one optical chip. Implant of multiple energies may provide multiple strips with separation layers from each other, in depth, allowing production of three dimensional, optically isolated Qubit structures. Such structures may significantly decrease the size of such devices since much of the volume could be utilized. Slot waveguides may also be formed.

It should also be noted that in the case of separated channel waveguides, that the waveguide can be altered in its properties by causing the waveguide to rise or fall in spots or along its length by application of heat or voltage cycling. This is in essence a fully attached device. This can be used as a switch to turn off or on the light or as a switch to move the light to another channel. In one embodiment, Qubits, optical switching and MEMS technology are combined into the same chip with its attendant applications. The use of masked or otherwise patterned implantation and lift-off technology permits the building of a range of waveguide structures such as sheets, plates, wires, disks and multiples of these shapes all with the possibility of modulation and switching as in optoelectronic and MEMS devices. It is also possible to build either normally open or normally closed switches and mixers by design of the proximity and shape of such waveguides.

Diamond Qubits may also be formed in conjunction with other semiconductors. Diamond may be bonded to other semiconductors such as silicon, gallium arsenide, gallium nitride, silicon carbide or III-IV alloys. The semiconductors can also be grown onto the diamond substrate. The attachment of diamond to other semiconductors will permit optoelectronic devices such as lasers, detectors and associated circuitry to be directly integrated with the diamond QBIT to provide input and output to and from conventional sources, devices and systems. This will provide the basis for optical busses for higher speed interconnects in conventional computers and future QBIT based computers. In fact a whole new family of integrated Qubit-Semiconductor devices (QSD) will be possible by combining the technologies and methods discussed.

Figure 2:
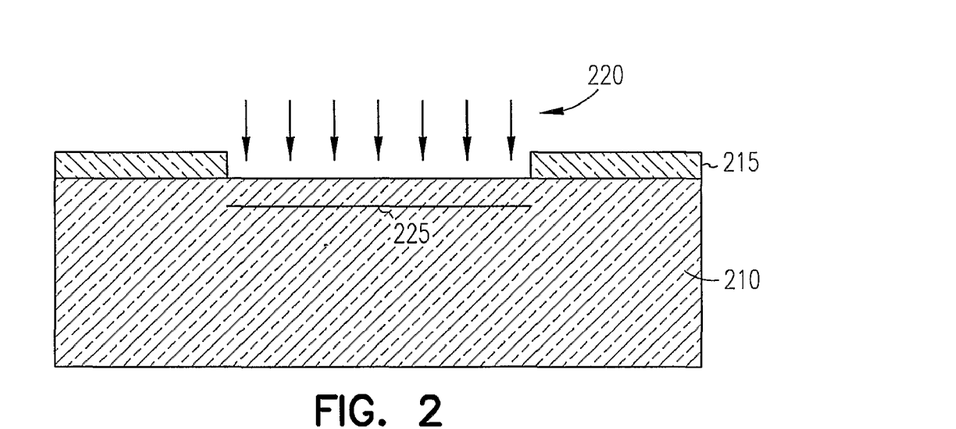
FIG. 2 is a side view cross sectional representation of a diamond illustrating a masked ion implant process according to an example embodiment.

FIG. 2 is a side view cross sectional representation of a diamond illustrating a masked ion implant process according to an example embodiment in order to form a waveguide in proximity to a Qubit formed as above. In one embodiment, the Qubit is an isolated Qubit, and the location of the Qubit is used as a guide for forming the waveguide, such that the Qubit is located within the waveguide. In further embodiments, the Qubit is formed in an already formed waveguide.

Figure 3:
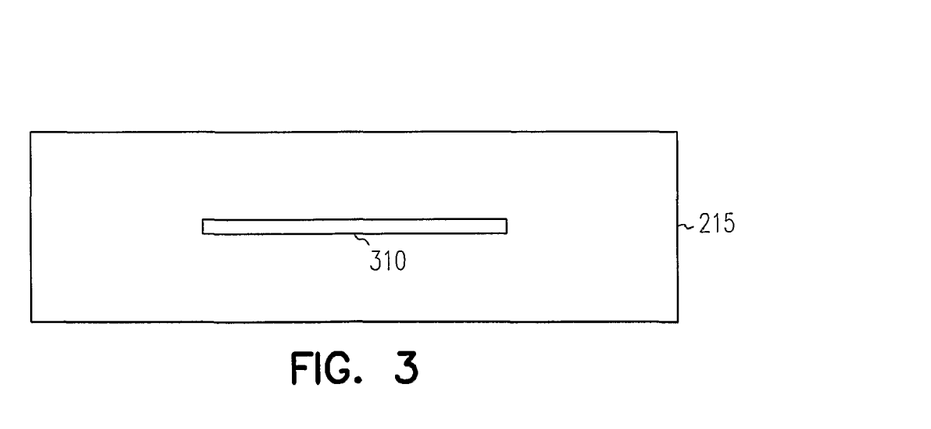
FIG. 3 is a top view of the diamond of FIG. 2, illustrating the mask for ion implantation according to an example embodiment.

A diamond substrate 210 is covered with a mask 215 in one embodiment. The mask 215 is formed of a material sufficient to screen out ions 220 being implanted at desired energy levels. The mask may take many different shapes, but one such shape is shown in top view FIG. 3 at 310. In this embodiment, the mask is in the shape of a long, thin rectangle, resulting in a long thin implant 225 at a desired depth.

Figure 4:
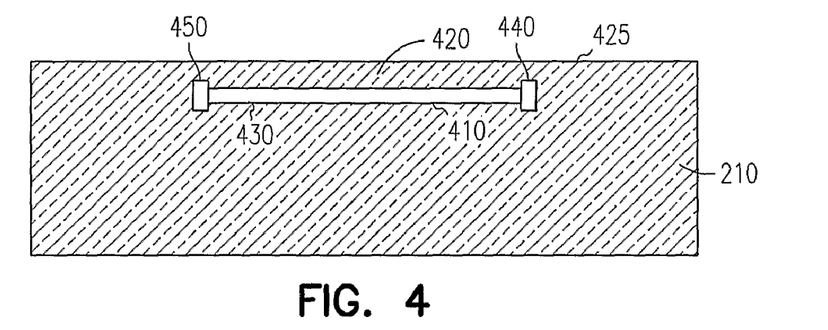
FIG. 4 is a side view cross sectional representation of the diamond of FIG. 2 following the ion implant and heating according to an example embodiment.

FIG. 4 is a side view cross sectional representation of the diamond 210 of FIG. 2 following the ion implant and heating to form an open space 410 within the diamond 210. Open space 410 provides a low refractive index region on one side of a strip of diamond indicated at 420. The other side of the strip 420 is essentially the top of the diamond 210, which may be exposed to air, also having a low refractive index compared to the index of refraction of the diamond strip 420. Thus, the diamond strip 420 forms a waveguide. A Qubit 430 is formed within the strip 420, and the strip provides a mechanism to capture and provide light to the Qubit to both detect and effect changes in the Qubit. It is evident that the strip 420 may be formed in different shapes, in order to conduct the light to a desired light source 440 and a light detector 450 which may each be further connected to processing circuitry, formed either, within, on, or off of the diamond substrate. The source 440 and light detector 450 may also be within, on, or off the diamond substrate in various embodiments. Optical fiber connections or optical couplers may be formed to conduct light to an from the waveguide strip 420.

In one embodiment, patterned ion implantation is employed to deliver one or more atomic species into and beneath the diamond growth surface in order to form an implanted layer with a peak concentration of atoms at a predetermined depth beneath the diamond growth surface. The composition is heated in a non-oxidizing environment under suitable conditions to cause separation of the synthetic diamond structure.

Such a non-oxidizing atmosphere generally includes any atmosphere not containing a sufficient concentration of oxygen so as to be reactive through oxidation. Examples of such atmospheres include inert (e.g., helium, neon, argon, etc.) and other non-oxygen containing gases (e.g., hydrogen, nitrogen, etc.). Environments used to provide such atmospheres can include plasmas, vacuums, and the like.

In certain embodiments of the invention, various initial steps can be performed prior to or concurrent with the ion implantation stage. One such step involves choosing a substrate. When growing single crystalline CVD diamond, for instance, such substrate may be a single crystalline diamond.

Upon selection of the substrate, at least one major surface of the substrate can be identified, and optionally prepared, for ion implantation. Preparation of the diamond surface can include any suitable means for affecting the chemical and/or physical make-up of the surface, for instance, by polishing using conventional polishing methods. Preparation of this sort can be accomplished in advance of the ion implantation. Typically, ions are implanted in a manner at a set distance and even flux across the diamond growth surface, such that the configuration of the implanted species layer will itself replicate the surface profile of the substrate. In turn, any defects on an implanted surface of the substrate will typically have a corresponding influence on the implant profile, including on the configuration of the predetermined peak atomic layer. Thus, such structures may actually be substantially polished if the surface of the diamond is polished. Preparation of the substrate can be important to initially remove such defects. In addition, in certain embodiments, surfaces are thoroughly cleaned for ion implanting, for instance, using solvents or other suitable methods known in the art, including plasma etching, gas phase etching and the like. Polishing damage may result in creation of undesired N-V centers. The surface of the polished diamond may be further etched to remove such damage and N-V centers.

Ion implantation is generally conducted under conditions of high vacuum, high voltage, and relatively low beam currents. As is known in the art, ion implantation typically involves the process of ionizing a species of atoms, subsequently accelerating the species in an electric field, and directing the accelerated, ionized species toward a substrate. With its rate of motion being accelerated, the species generally penetrates an outer surface of the substrate and come to rest within a zone in the substrate as indicated at 225 in FIG. 2.

The zone is within an implanted layer of the substrate. In one embodiment, the species is accelerated toward the substrate at an angle generally normal or vertical to the surface. However, the species can also be accelerated toward the substrate at a wide variety of angles as well. For a given species, the depth of implantation is generally accomplished with adjustments made to the electric field. Typically, as one increases the voltage of the electric field, the energy of the species is increased, which ultimately results in a deeper implantation by the species into the substrate. It is fully contemplated that the substrate may be any of a variety of crystalline shapes. For example, the substrate may be of any predetermined geometry including a cube, cone, prism, pyramid, wedge, or other geometries, as well as frustums of each.

The species generally penetrates the upper surface of the substrate until reaching a zone, such as zone 225 within the substrate. A peak concentration of the species is at a certain depth generally known as the end of range depth. While the species is only shown at the one depth (the end of range depth), it should be appreciated that this is done for simplicity. Following ion implantation, the species is generally distributed throughout the zone at and proximate to the end of range depth.

Before ion implantation is started, the species to be implanted must be selected. Many variables are considered in selecting a species, such as cost and availability, as well as concern for how much damage the species is expected to cause to the substrate lattice, as described below.

During ion implantation, by directing the species (of ionized atoms) into the crystal lattice of the substrate, the implanted portion of the lattice generally dilates or expands. Excessive dilation of the lattice in this manner generally leads to strain within the implanted layer. Consequently, excessive strain can cause damage to the implanted layer. This damage is generally represented by dislocations, or cracking, within the implanted layer. These dislocations can generally create an unfavorable outer substrate surface for growing quality synthetic diamond (e.g., producing diamond via CVD having no defects or dislocations, or insignificant amounts thereof). However, the manner in which lattice dilation can be controlled in a number of ways, and in fact, relied upon.

One way involves selecting an appropriate species for implanting. In certain embodiments of the invention, hydrogen ions are implanted within a diamond substrate using the conventional techniques of ion implantation. Since the covalent radius of hydrogen is small, only a small amount of lattice dilation occurs within the implanted layer. Consequently, there is little strain (and little damage) within the implanted layer. Generally, as the covalent radius of the implanted species increases, the potential for creating such a favorable surface (e.g., having limited defects or dislocations) decreases.

Generally, any species can be used for ion implanting in the inventive process so long as the species is suitable for subsequently enabling separation of a portion of the implanted layer from the substrate. As such, the species is selected so as to allow for suitable implantation within the substrate. Examples of such species include most, if not all, atomic elements. In certain embodiments of the invention, the substrate is also used for growing a synthetic diamond thereon. As such, the species preferably allows for suitable implantation within the substrate to enable separation, and allows for suitable formation of a favorable growth surface on the substrate from which a quality synthetic diamond can be grown. Therefore, the species is selected so as to allow for suitable implantation within the substrate without undesirably damaging the substrate. Small- to medium-sized species (having small- to medium-sized covalent radiuses) are generally preferred. Examples include atomic species such as helium, lithium, boron, carbon, oxygen, phosphorous, and sulfur. However, embodiments of the process can also involve large-sized species (having large-sized covalent radiuses). In such embodiments, other parameters affecting the implant of the species, such as species dose quantity and species energy level, are considered so as to limit the amount of damage to the substrate lattice upon implantation of the larger-sized species.

The extent of lattice damage to the implanted portion can be limited by the dose quantity of the species implanted, with the dose being defined as the area density of atoms (atoms/$cm^2$) which are implanted into the substrate. For example, if the species is implanted using a high dose, the species will generally cause more damage to the substrate upon implantation than if a species were implanted using a lower dose. As the species (of ionized atoms) travels through the substrate, the damage to the substrate lattice is generally maximized near the end of the species range into the substrate (generally referred to as "end of range damage").

In turn, the degree of damage at the end of range is a function of the total dose at that level. However, the ability to cause separation within the diamond crystal is also a function of the total dose. At dose levels that are too low, there will be no separation, while at levels that are too high for a particular embodiment, there can be excessive damage and poor diamond growth. In some embodiments, the dose quantity is set in the range from about $1 \times 10e^{14}$ atoms/cm$^2$ to about $1 \times 10e^{20}$ atoms/cm$^2$, and even more preferably, is set in the range from about $1 \times 10e^{15}$ atoms/cm$^2$ to about $1 \times 10e^8$ atoms/cm$^2$. When implanting species of large sizes, in order to limit lattice damage, it is generally preferable to choose a dose quantity on the lower end of the range. Conversely, when implanting species of small to medium sizes, any dose quantity within the range is generally suitable.

In addition, the extent of lattice damage to the diamond growth surface can be controlled by modifying the voltage of the electric field used in ion implantation. As one increases the voltage of the electric field, the energy of the species increases as well, ultimately resulting in a deeper implantation by the species into the substrate. In turn, the energy level can be selected for a specific species so as to implant a peak concentration of the species at about a certain implantation depth within the substrate (the end of range depth). This depth may range anywhere from about 500 angstroms to about 20,000 angstroms. While the end of range depth for the species can be limited by decreasing the species energy, one ought not limit the energy too severely.

In some embodiments of the invention, the energy level is set in the range from about 10 KeV to about 10,000 KeV, and in another embodiment, is set in the range from about 50 KeV to about 500 KeV. When implanting species of large sizes, in order to limit lattice damage of the substrate, it may be desired to select the species energy on the higher end of this range. As such, the large size species are implanted further from the diamond growth surface, thereby attempting to isolate any lattice damage from the diamond growth surface. Conversely, when implanting species of small to medium sizes, the method provides more freedom in selecting the species energy.

The species dose rate may affect the temperature of the substrate during the implant. If the dose rate is too high, unwanted graphitization of the zone of the implanted layer may occur. In some embodiments of this invention, the dose rate is set in the range from about 0.05 microamps/cm$^2$ to about 100 milliamps/cm$^2$, and in others, is set in the range from about 0.1 microamps/cm$^2$ to about 500 microamps/cm$^2$.

In one embodiment, implants at multiple levels, followed by heating are performed to create gaps at different levels of the substrate. One example provides three such gaps by implanting H$_2$ at energy levels of 150, 155 and 160 KeV. This can provide three levels of structures, such as waveguides, with potential corresponding isolated N-V centers.

Given the present description, those skilled in the art will appreciate the manner in which the end of range depth of the species can be determined, given specifics regarding the species implanted and the energy used. Such calculations are generally known as TRIM (Transport of Ions in Matter) calculations. See J. P. Biersack et al., *A Monte Carlo Computer Program for the Transport of Energetic Ions in Amorphous Targets*, Nucl. Instr. Meth., pp. 174:257 (1980), the teachings of which are incorporated herein by reference. See also generally J. F. Ziegler et al., *In the Stopping and Range of Ions in Matter*, Pergamon Press, N.Y., vol. 1 (1985), the teachings of which are incorporated herein by reference. Table 1 lists the approximate end of range depths for various species at various energy levels, given a diamond seed being used as the substrate. Regardless of whether the diamond seed is HPHT, CVD, or natural diamond, the end of range depths for the species generally remain the same. As illustrated, as the energy level is increased for a species such as hydrogen, its end of range depth is also increased. Calculations were run at an energy level of about 200 keV for species including boron and carbon to demonstrate that as the atom diameter of the species increased, the corresponding end of range depth decreased. In addition, it should be noted that in order to achieve similar end of range depths (e.g., 1900 angstroms to 2000 angstroms), energy levels would have to be increased by a factor of four when using carbon as the implant species as opposed to hydrogen.

TABLE 1

Implant Depths as a Function of Atom Implanted and Implant Energy

| Implanted | Implant Energy | | | |
|---|---|---|---|---|
| Ion/atom | 50 keV | 100 keV | 200 keV | 1,000 keV |
| Hydrogen | 1900 Å | 3700 Å | 7200 Å | 63500 Å |
| Boron |  |  | 2800 Å |  |
| Carbon |  |  | 2000 Å |  |

Heat treatments are provided on the diamond composition in the non-oxidizing atmospheres. Such treatments can be provided by any suitable method, including radiation, conduction, or convection sources, all generally known in the art. Generally, the temperature range of the heat treatments is preferably set in the range from about 1100° C. to about 1800° C. and, more preferably, about 1100° C. to about 1500° C. The combination of the appropriate atmosphere and the temperature levels provides an ideal environment to cause spontaneous separation of the synthetic diamond and the implanted layer portion.

Figure 5:
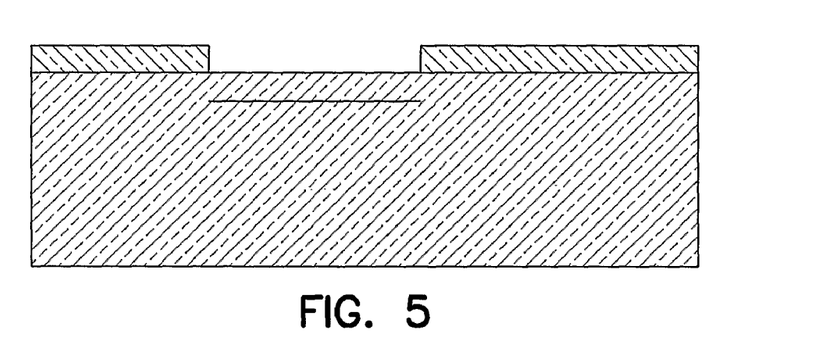
FIG. 5 is a side view cross sectional representation of a diamond illustrating a masked ion implant process for forming a cantilever according to an example embodiment.

FIG. 5 is a side view cross sectional representation of a diamond illustrating a masked ion implant process for forming a cantilever according to an example embodiment. In this embodiment, a first mask is used to form a generally rectangular area which will end up defining the size of a cavity in which the cantilever will be released to be free to move. As can be seen, shapes other than rectangular may be used. Depending on the size of elements desired, the implantation depth may be varied, such that a sufficient density of ions are implanted in the entire area beneath the cantilever and to the sides of the cantilever to allow sufficient motion once the cantilever is released to move. Thus, the mask extends at least slightly beyond the edges and released end of the cantilever.

Figure 6:
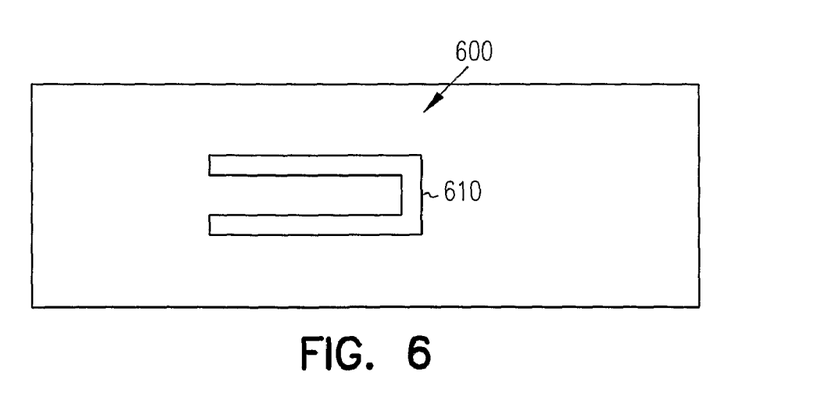
FIG. 6 is a top view representation of an ion implantation mask used to form a cantilever according to an example embodiment.
Figure 7:
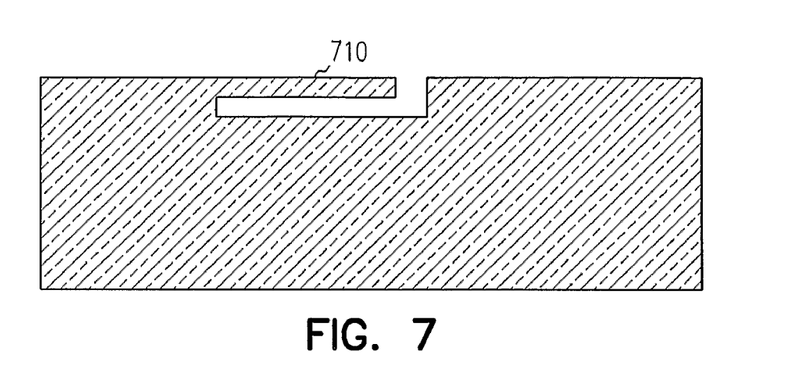
FIG. 7 is a side view cross sectional representation of a released cantilever according to an example embodiment.

Following ion implantation to form the base of the cavity, a new mask is used as shown in FIG. 6, which is a top view representation of an ion implantation mask 600 used to form a cantilever according to an example embodiment. This mask allows implantation to the sides and past the released end of the cantilever, while defining the shape of the cantilever itself with projection 610. The energy levels of implantation used with this mask are designed to implant a sufficient density of ions to the sides and released end of the cantilever. This implant may vary the depth of implant from the surface of the diamond substrate to the cavity defined below the cantilever. Thus, heating in a non-oxidizing environment released the cantilever as shown in FIG. 7, which is a side view cross sectional representation of a released cantilever beam 710 according to an example embodiment. Alternatively, releasing may be performed using a carbon implant at the edges and etching by oxidation via heat, electrolysis or oxidizing acid.

In one embodiment, cantilever beam 710 tends to curve upward when released. Further implants in the upper levels may be provided either prior to or after release of the cantilever beam. Such implants, depending on depth and density, will begin to straighten the cantilever by putting the surface in compression, and if continued, may actually cause the cantilever beam to curve downward.

As can be seen from the formation of the cantilever beam 710, many other three dimensional structures may be created with the use of one or more masks, and varying the depths of multiple implants to remove desired materials. Such structures may also be further cleaned in acid solutions to remove undesired residual implanted diamond material. The structures may be used for many different applications, including NEMs and MEMs devices have general applications. Such devices may be useful as sensors and other mechanical devices having a wide variety of applications beyond Qubit devices, such as medical devices.

Figure 8:
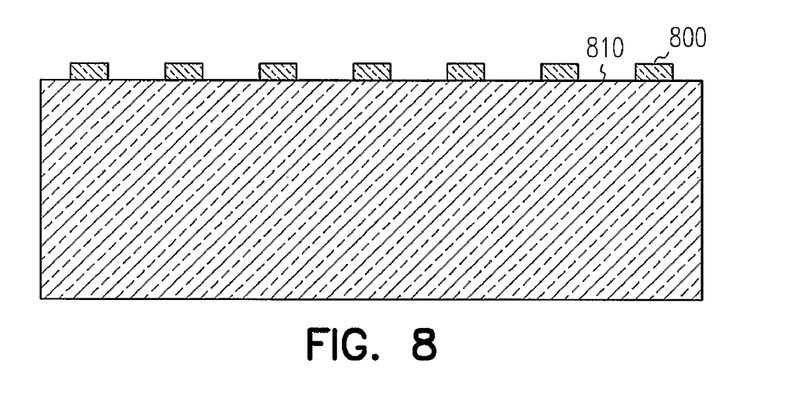
FIG. 8 is a side view cross sectional representation of a masked diamond for forming optical structures according to an example embodiment.
Figure 9:
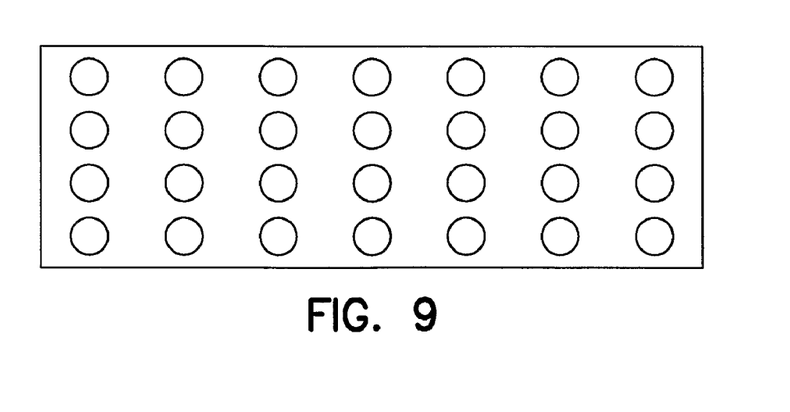
FIG. 9 is a top cross sectional view of the diamond of FIG. 8 illustrating optical structures formed according to an example embodiment.

FIG. 8 is a side view cross sectional representation of a masked diamond for forming optical structures according to an example embodiment. In one embodiment, the mask 800 comprises an array of one or more multiple round openings 810. The resulting implants at a desired depth followed by heating, forms an array of disk like voids 910, as shown in FIG. 9, which is a top cross sectional view of the diamond of FIG. 8. The disk like voids 910 may behave as a pump, or optical deflector in one embodiment. When formed near the surface of the diamond, the surface of the diamond bubbles up slightly. These bubbles can result in optical fringe effects, including color changes. In one embodiment, the disks are approximately 500 nm in diameter. Other shapes and sizes may easily be formed.

In one embodiment, further masks and implants may be used to fully release the diamond above each of the disk like voids, to create small lens like structures. Such structures may be of desired thicknesses tied to the implant levels. In one embodiment, the lenses are approximately 50 um thick, forming an etalon or optical filter. It should be noted that lasers and other method of releasing the lenses may be utilized in addition to varying depth implants and heat to release the lenses. In some embodiments, thicknesses of less than 1 um are utilized. The thickness may also be a function of the desired wavelength of operation of the optical device including such structures.

The Abstract is provided to comply with 37 C.F.R. §1.72(b) to allow the reader to quickly ascertain the nature and gist of the technical disclosure. The Abstract is submitted with the understanding that it will not be used to interpret or limit the scope or meaning of the claims.

The invention claimed is:

1. A method of forming a waveguide in diamond, the method comprising:

performing an ion implantation to define a strip of diamond within the diamond having a length and a high index of refraction; and heating the diamond to create areas on both sides of the diamond having a low index of refraction such that the strip of diamond is operable to conduct light along the length of the strip of diamond.

2. The method of claim 1 wherein the low index of refraction areas comprise voids in the diamond.

3. The method of claim 1 and further comprising using a mask to control ion implantation.

4. The method of claim 3 wherein the mask prevents ions from being implanted in the strip of diamond.

5. The method of claim 4 wherein the mask is in the shape of a long thin rectangle through which ions may pass, and wherein the implantation penetrates the diamond to a desired depth.

6. The method of claim 5 wherein one side of the strip of diamond is the surface of the diamond and the other side of the strip of diamond is a void created by the implanted ions and heating.

7. The method of claim 1 wherein the diamond is polished prior to the implant.

8. The method of claim 1 wherein the diamond is a single crystalline chemical vapor deposition grown diamond.

9. The method of claim 1 wherein the strip of diamond is straight.

10. The method of claim 1 wherein the ions comprise hydrogen ions.

11. The method of claim 1 wherein the ion implantation is performed at multiple depths to form strips of diamond at different depths in the diamond.

12. A method of forming a waveguide in diamond, the method comprising:

performing an ion implantation to define a slot within the diamond having a length; and heating the diamond to create a slot waveguide from the slot having an index of refraction lower than that of the diamond and being operable to conduct light along the length of the slot.

13. The method of claim 12 and further comprising using a mask to control ion implantation.

14. The method of claim 13 wherein the mask is in the shape of a long thin rectangle through which ions may pass, and wherein the implantation penetrates the diamond to a desired depth.

15. The method of claim 12 wherein the diamond is a single crystalline chemical vapor deposition grown diamond and is polished prior to the implant.

16. The method of claim 12 wherein the ion implantation is performed at multiple depths to form strips of diamond at different depths in the diamond.

\* \* \* \* \*